United States Patent
Liu et al.

(10) Patent No.: US 8,299,471 B2
(45) Date of Patent: Oct. 30, 2012

(54) ORGANIC ELECTROLUMINESCENT DEVICE AND FABRICATION METHOD THEREOF

(75) Inventors: Hanson Liu, Kaohsiung (TW); Ryan Lee, Hualien (TW); Chun-Hsiang Fang, Yilan Hsien (TW)

(73) Assignee: Chimei Innolux Corporation, Chu-Nan (TW)

( * ) Notice: Subject to any disclaimer, the term of this patent is extended or adjusted under 35 U.S.C. 154(b) by 569 days.

(21) Appl. No.: 12/322,039

(22) Filed: Jan. 27, 2009

(65) Prior Publication Data

US 2009/0206737 A1 Aug. 20, 2009

(30) Foreign Application Priority Data

Feb. 20, 2008 (TW) ................................ 97105862 A

(51) Int. Cl.
*H01L 27/14* (2006.01)
*H01L 21/00* (2006.01)
*H01L 21/84* (2006.01)

(52) U.S. Cl. .............. 257/72; 438/153; 257/E33.053; 257/E21.633

(58) Field of Classification Search .............. 313/504; 257/E33.053, 72; 438/151.22
See application file for complete search history.

(56) References Cited

U.S. PATENT DOCUMENTS

| | | | |
|---|---|---|---|
| 7,863,602 B2* | 1/2011 | Huh et al. ................. | 257/40 |
| 2002/0066901 A1* | 6/2002 | Yamanaka et al. .......... | 257/59 |
| 2004/0195570 A1* | 10/2004 | Koo et al. .................... | 257/72 |
| 2005/0056841 A1* | 3/2005 | Yamazaki et al. ........... | 257/59 |
| 2005/0062047 A1* | 3/2005 | Nishikawa et al. ......... | 257/72 |
| 2005/0176194 A1* | 8/2005 | Sasaki et al. ............... | 438/197 |
| 2007/0120143 A1* | 5/2007 | Huh et al. .................... | 257/103 |
| 2007/0257250 A1* | 11/2007 | Tseng et al. ................ | 257/40 |
| 2007/0262311 A1* | 11/2007 | Liu et al. .................... | 257/66 |
| 2008/0238302 A1* | 10/2008 | Sung et al. ................. | 313/504 |
| 2009/0002590 A1* | 1/2009 | Kimura ....................... | 349/43 |
| 2009/0142909 A1* | 6/2009 | Jinbo et al. ................ | 438/482 |
| 2009/0179550 A1* | 7/2009 | Koo et al. .................... | 313/504 |

* cited by examiner

*Primary Examiner* — Matthew Landau
*Assistant Examiner* — Latanya N Crawford
(74) *Attorney, Agent, or Firm* — Liu & Liu

(57) ABSTRACT

The invention discloses an organic electroluminescent device includes a substrate. The substrate includes a first control area and a second control area, a polysilicon active layer disposed on the first control area, and a first conductivity type source/drain area disposed in the polysilicon active layer. A first dielectric layer is disposed on the polysilicon active layer serving as a first gate dielectric layer, a first gate and a second gate is disposed on the polysilicon active layer and the second control area, respectively, wherein the first gate and the first conductivity type source/drain area constitute a first conductivity type thin film transistor serving as a switch element. A second dielectric layer disposed on the first gate and the second gate serves as a second gate dielectric layer, a microcrystal silicon active layer disposed over the second gate.

16 Claims, 11 Drawing Sheets

ORGANIC ELECTROLUMINESCENT DEVICE AND FABRICATION METHOD THEREOF

CROSS REFERENCE TO RELATED APPLICATIONS

This application claims the benefit of Taiwan Patent Application No. 097105862, filed on Feb. 20, 2008.

BACKGROUND OF THE INVENTION

1. Field of the Invention

The present invention relates to a display device and fabrication methods thereof, and more particularly to an organic electroluminescent device and fabrication methods thereof.

2. Description of the Related Art

The demand for active-matrix flat panel displays (FPDs) has increased rapidly in recent years. Currently, advanced techniques for forming thin film transistors (TFTs) are needed. In conventional TFT fabrication, an amorphous silicon film formed on a glass substrate is typically used as a channel or active layer of the transistor.

Compared with polysilicon film, amorphous silicon film has a smaller grain size and irregular grain arrangement, thus reducing the electron mobility and lowering the performance of the TFT. Generally, the electron mobility of polysilicon film is 100 times higher than that of amorphous silicon film. In semiconductor fabrication, polysilicon film is typically prepared by low pressure chemical vapor deposition (LPCVD) and then annealed at a temperature above 900° C. The same method cannot be employed for a FPD as the strain temperature of glass is about 650° C. Thus, low temperature polysilicon (LTPS) is a novel application for FPD technology. Moreover, LTPS integrates driving circuits on a glass substrate having pixels thereon, reducing manufacturing costs.

In general, the excimer laser annealing crystalline technology is employed to transfer the amorphous silicon into polysilicon during the LTPS process. However, a laser line system is used in the excimer laser annealing process. Therefore, the energy variation of the laser line beams directly alter the properties of the obtained crystalline grains, thereby causing threshold voltage (Vth) and electric current distinctions between obtained TFTs. As well, the luminescent uniformity of active-matrix organic light emitting displays (AM-OLEDs) is reduced to produce image defects, such as image mura. Therefore, the display quality of AM-OLEDs is adversely affected by image mura defect. In this regard, it has been found that micro-crystal silicon having a relatively high uniformity can be formed by non-laser crystallization technology. However, the grain size of the micro-crystal silicon is smaller than that of polysilicon, thus the mobility of micro-crystal silicon is lower than the mobility of polysilicon.

In an active-matrix organic light emitting display (AM-OLED), the electrical characteristics of driving elements are different from those of the switch elements in the pixel region. For example, the driving elements have substantially the same threshold voltage in the pixel region. However, the switch elements serving as an OLED have relatively lower threshold voltage to reduce power consumption and extend the operating lifespan thereof. Namely, the micro-crystal silicon can be used as a driving element in a pixel area to improve display quality because it has a uniform grain size for improving image defects. On the other hand, polysilicon can be used as a switch element in a pixel area with its high electron mobility for generating a lower threshold voltage.

Since the mobility of micro-crystal silicon is lower than the mobility of polysilicon, it is difficult to integrate micro-crystal silicon formed by a non-laser annealing process and polysilicon formed by a laser annealing process so as to form thin film transistors with the desired electrical characteristics over the driving elements and the switch elements at the same time.

Therefore, it is necessary to develop a novel LTPS process for an active matrix organic electroluminescent device to prevent an OLED from being affected by the above constraints.

BRIEF SUMMARY OF THE INVENTION

The aforementioned constraints are generally solved or circumvented, and technical advantages are generally achieved, by the preferred illustrative embodiments according to the present invention, which provide organic electroluminescent devices.

One embodiment of the invention discloses an organic electroluminescent device comprising a substrate. The substrate includes a first control area and a second control area, a polysilicon active layer disposed on the first control area, and a first conductivity type source/drain area disposed in the polysilicon active layer. Also, a first dielectric layer is disposed on the polysilicon active layer serving as a first gate dielectric layer, and a first gate and a second gate are respectively disposed on the polysilicon active layer and the second control area, wherein the first gate and the first conductivity type source/drain area constitute a first conductivity type thin film transistor serving as a switch element, and a second dielectric layer disposed on the first gate and the second gate serve as a second gate dielectric layer. A micro-crystal silicon active layer is disposed over the second gate, and a second conductivity type source/drain area is disposed in the micro-crystal silicon active layer, wherein the second gate and the second conductivity type source/drain area constitute a second conductivity type thin film transistor serving as a driving element.

Another embodiment of the invention discloses a method for forming an organic electroluminescent device. The method for forming an organic electroluminescent device includes providing a substrate comprising a first control area and a second control area, forming a polysilicon active layer on the first control area, and forming a first conductivity type source/drain area in the polysilicon active layer. Also, a first dielectric layer is formed on the polysilicon active layer serving as a first gate dielectric layer, and a gate conductive layer is formed on the first dielectric layer. The gate conductive layer is patterned for respectively forming a first gate and a second gate on the polysilicon active layer and the second control area, wherein the first gate and the first conductivity type source/drain area constitute a first conductivity type thin film transistor serving as a switch element. A second dielectric layer is formed on the first gate and the second gate serving as a second gate dielectric layer, and a micro-crystal silicon active layer is formed over the second gate. A second conductivity type source/drain area is formed in the micro-crystal silicon active layer; wherein the second gate and the second conductivity type source/drain area constitute a second conductivity type thin film transistor serving as a driving element.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
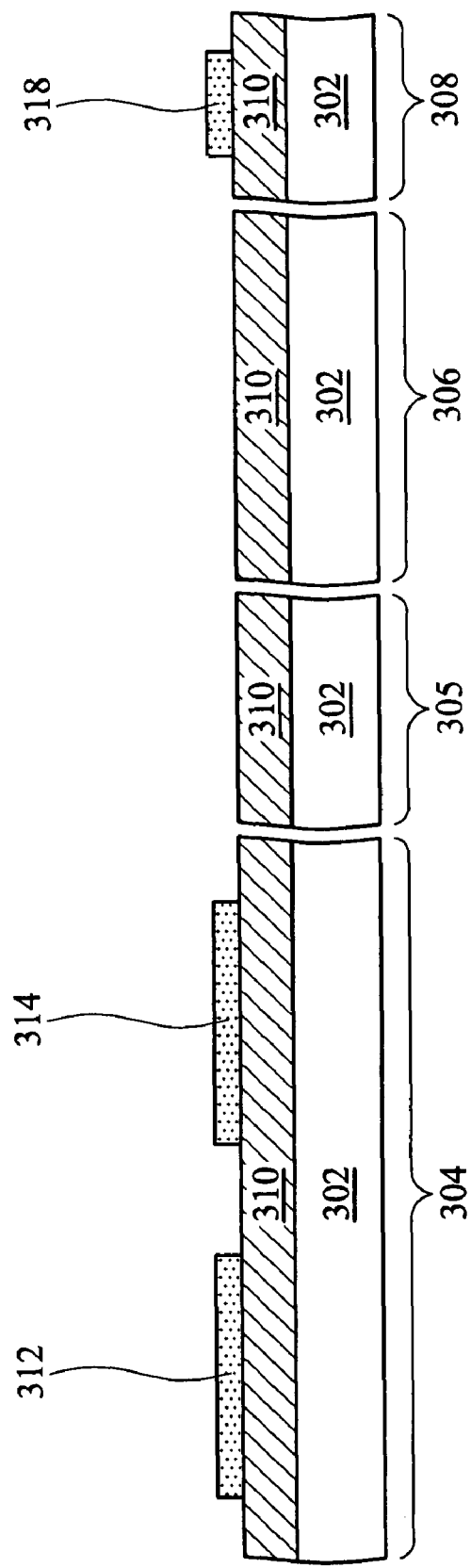
FIGS. 1 to 10 show an intermediate cross section of an organic electroluminescent device in accordance with an embodiment according to the invention.

The invention will be described in greater detail by referring to the accompanying drawings. In the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

FIGS. 1 to 10 show cross sections of a preferred embodiment of a process for fabricating an organic electroluminescent device according to the present invention. Wherever possible, the same reference numbers are used in the drawings and the descriptions to refer to the same or like parts.

Referring to FIG. 1, a substrate 302 comprising a first control area 304, a second control area 305, a sensitive area 306 and a capacitor area 308 is provided, and a buffer layer 310 is formed on the substrate 302. The buffer layer 310 can comprise silicon oxide or silicon nitride, and preferably is a stack of a silicon oxide layer and a silicon nitride layer. In a preferred embodiment, thickness of the silicon nitride layer is about 350 Å~650 Å, and thickness of the silicon oxide layer is about 1000 Å~1600 Å.

Figure 2:
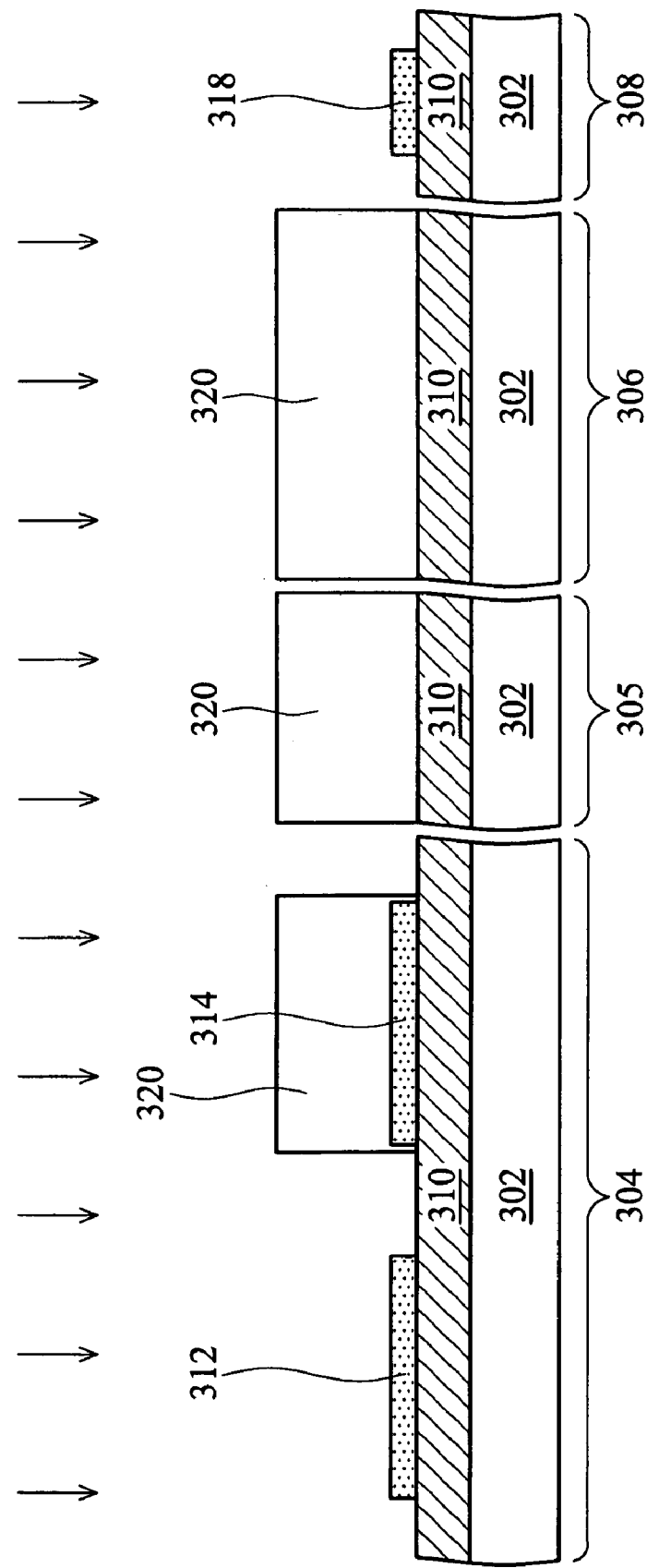

Next, a first conductive layer (not shown) is formed on the buffer layer 310. The conductive layer can comprise polysilicon. For example, an amorphous silicon layer is first formed by deposition by a chemical vapor deposition process and then crystallized or annealed with an excimer laser, ELA to form a polysilicon layer. The first conductive layer is defined by a conventional lithography and etching process to form a polysilicon active layer 312, a polysilicon active layer 314 that overlies the first control area 304 of the substrate 302, and a first electrode 318 that overlies the capacitor area 308 of the substrate 302. Since the amorphous silicon layer is crystallized or annealed with an excimer laser, the polysilicon active layer 312, the polysilicon active layer 314, and the first electrode 318 can be converted into polysilicon, which has high electronic transmission speed. Referring to FIG. 2, the polysilicon active layer 314, the second control area 305 and the sensitive area 306 are covered by photoresist layers 320. Next, an optional channel doping process is performed to implant a dopant into the polysilicon active layer 312 and the first electrode 318, wherein the dopant thereof preferably comprises B+ ions, and the dosage is typically about 0~1E13 ions/cm$^2$. Then, the photoresist layers 320 are removed.

Figure 3:
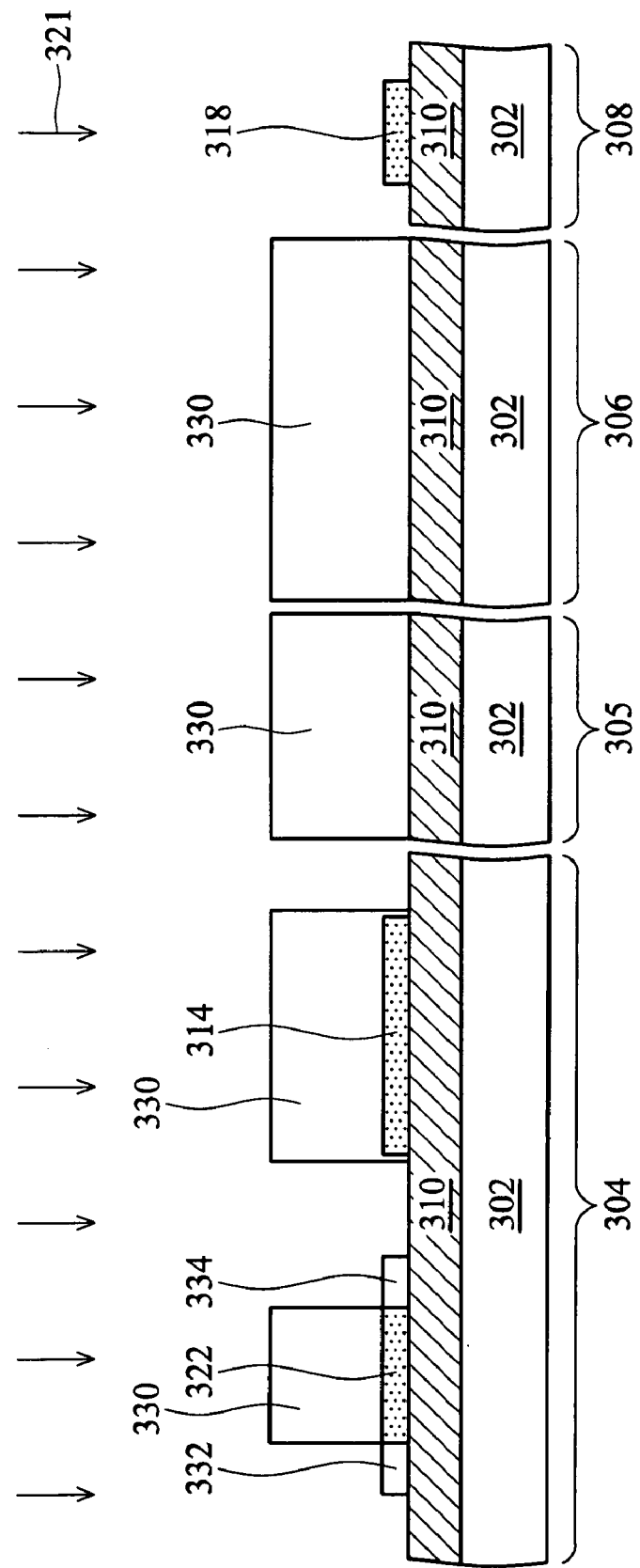

Referring to FIG. 3, a predetermined channel region of the polysilicon active layer 312, the polysilicon active layer 314, the second control area 305 and the sensitive area 306 are covered by another photoresist layer 330, implanting N+ ions 321 into the polysilicon active layer 312 to form a source 332, a drain 334, and a channel region 322 undoped with N+ ions 321 of an N-type transistor. Simultaneously, N+ ions 321 are implanted into the first electrode 318, thus, the conductivity of the first electrode 318 can be converted into N-type. In a preferred embodiment of the invention, the N+ ions 321 may comprise phosphorous, and the dosage is preferably about $1\times10^{14}$~$1\times10^{16}$ ions/cm$^2$.

Figure 4:
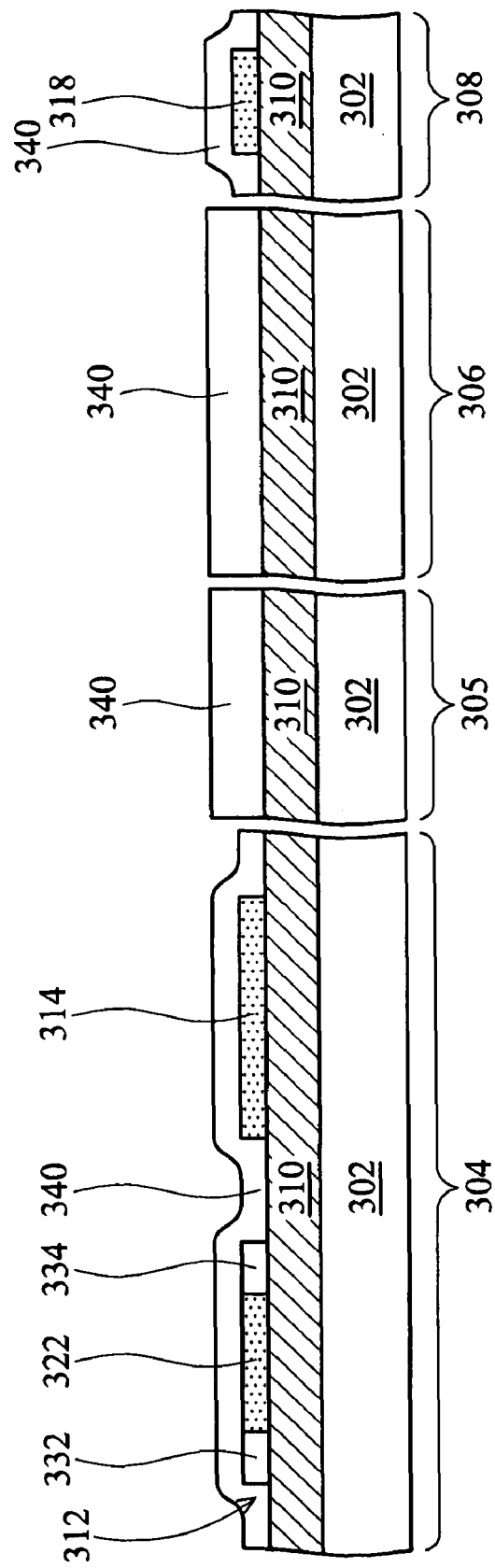

Referring to FIG. 4, the photoresist layers 330 are removed, and a first dielectric layer 340, for example comprised of silicon oxide, silicon nitride, silicon oxynitride, a combination thereof or a stack layer thereof, is blanketly deposited on the polysilicon active layer 312 and the polysilicon active layer 314 of the first control area 304, the second control area 305, the sensitive area 306, and the first electrode 318 of the capacitor area 308, in which the first dielectric layer 340 on the first electrode 318 of the capacitor area 308 serves as a capacitor dielectric layer.

Figure 5:
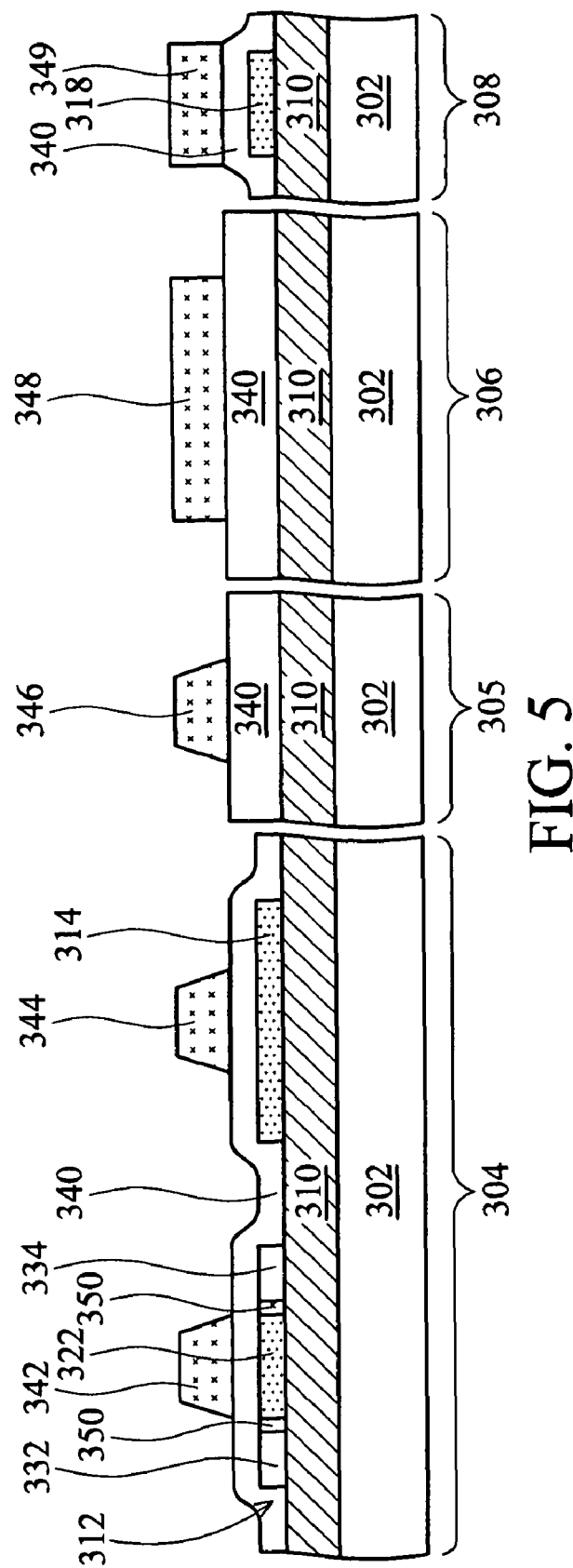

Referring to FIG. 5, a gate conductive layer (not shown), for example comprised of doped polysilicon or metal, is blanketly formed on the first dielectric layer 340. In a preferred embodiment according to the invention, the gate conductive layer can be a metal and about 1500 Å~2500 Å thick.

Next, the gate conductive layer is patterned by a conventional lithography and etching process to form a gate 342 overlying the polysilicon active layer 312, a gate 344 overlying the polysilicon active layer 314, a gate 346 overlying the second control area 305, a light shielding metal layer 348 over the sensitive area 306, and a second electrode 349 over the first dielectric layer 340. In this embodiment, the width of the gate 342 overlying the polysilicon active layer 312 is shorter than the width of the channel region 322. Next, subsequent to the formation of the gate 342, 344 and 346, the light shielding metal layer 348 and the second electrode 349, a light doping process, for example an ion implantation process, can be performed to form lightly doped source/drain regions (LDD) 350 on opposite sides of the channel region 322 of the polysilicon active layer 312 of the N-type transistor.

Figure 6:
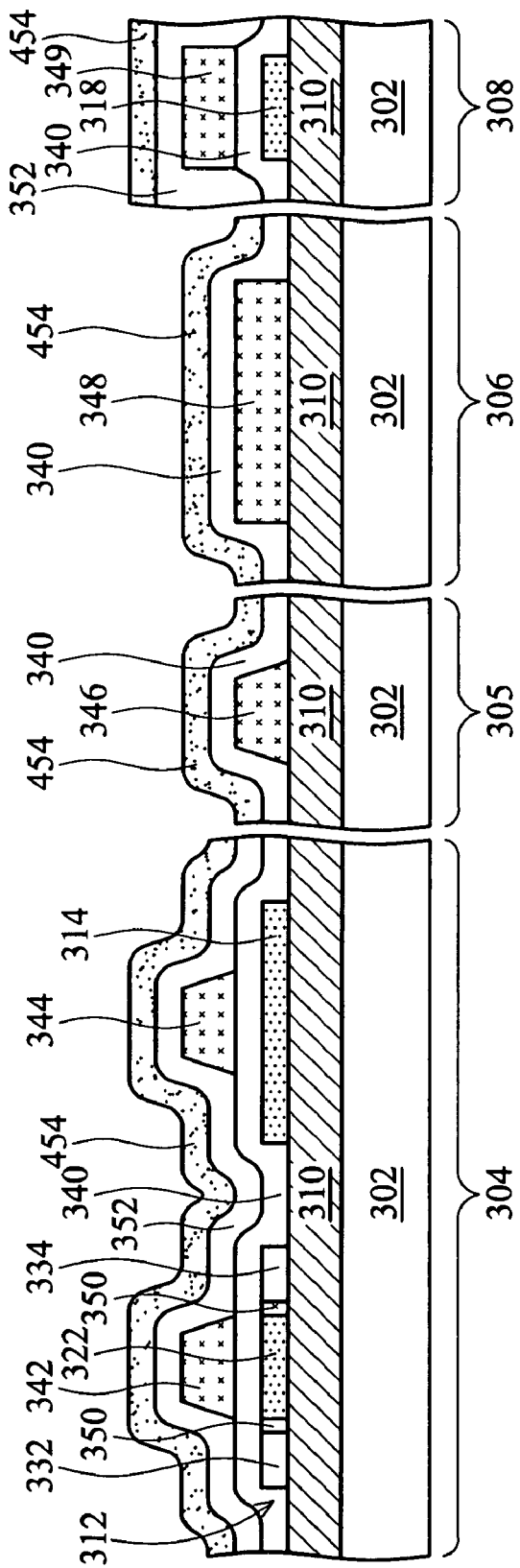

In FIG. 6, a second dielectric layer 352 is blanketly deposited overlying the first control area 304, the first dielectric layer 340 of the second control area 305 and the sensitive area 306, and the second electrode 349 of the capacitor area 308. The second dielectric layer 352 overlying the first control area 304, the second control area 305 and the sensitive area 306 can serve as a second gate dielectric layer, and the second dielectric layer 352 overlying the capacitor area 308 can serve as a capacitor dielectric layer.

Generally, the thickness and composition of the second dielectric layer 352 can be determined according to product spec or process window. For example, the second dielectric layer 352 may be comprised of silicon oxide, silicon nitride, silicon oxynitride, polyimide, spin-on-glass (SOG), fluoride-doped silicate glass (FSG), and/or other materials. In an embodiment according to the invention, the second dielectric layer 352 is silicon oxide having a thickness of between 1500 Å and 2500 Å. In another embodiment according to the invention, the second dielectric layer 352 is silicon nitride having a thickness of between 2500 Å and 3500 Å.

Referring to FIG. 6 again, a second conductive layer 454 is blanketly deposited on the second dielectric layer 352, and the second conductive layer 454 is comprised of micro-crystal silicon. In one embodiment according to the invention, the second conductive layer 454 can be formed by processes, such as chemical vapor deposition (CVD), or plasma enhanced chemical vapor deposition (PECVD) process or any other suitable process and the grain size of the polysilicon of the first conductive layer is larger than the grain size of the micro-silicon of the second conductive layer 454.

Figure 7:
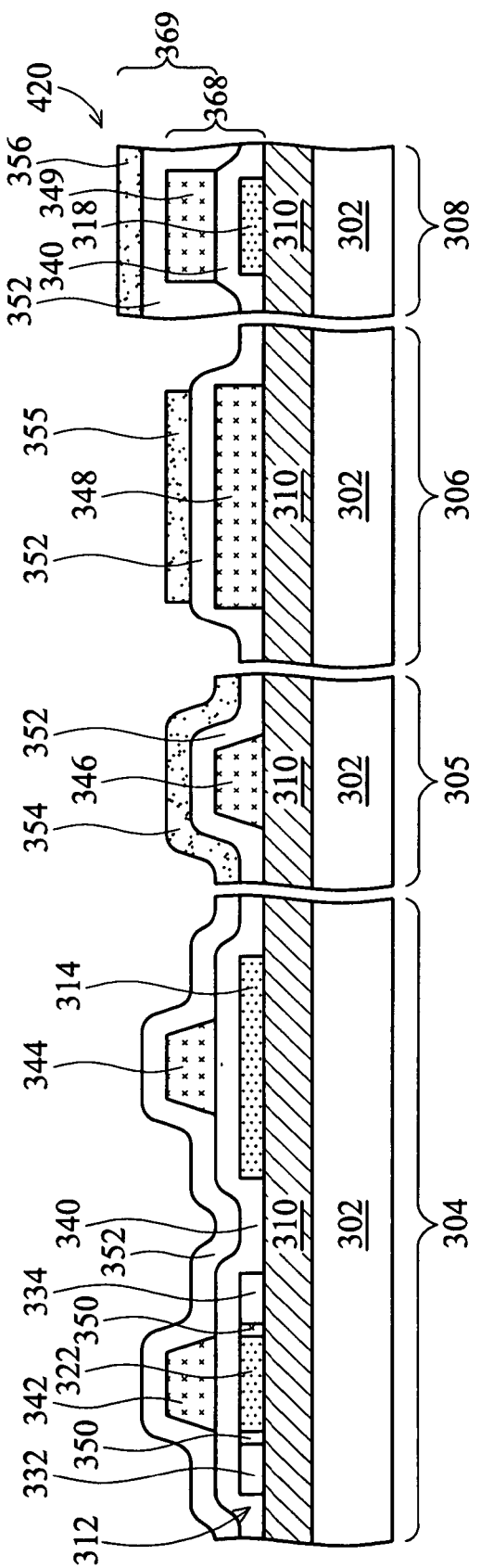

Referring to FIG. 7, the second conductive layer 454 is patterned by a conventional lithography and etching process to remove the second conductive layer 454 over the first control area 304 and define a micro-crystal silicon active layer 354, a photo-sensing layer 355 and a third electrode 356 which correspond to the second dielectric layer 352 over the gate 346, the light shielding metal layer 348 and the second electrode 349 respectively. Therefore, in the capacitor area 308, the first electrode 318, the first dielectric layer 340 and the second electrode 349 constitute a first storage capacitor 368 and the second electrode 349, the second dielectric layer 352 and the third electrode 356 constitute a second storage capacitor 369. It is noted that, in the capacitor area 308, a capacitor 420 can be formed by stacking the first storage capacitor 368 and the second storage capacitor 369 electrically connected in parallel with the first storage capacitor 368. The capacitor 420 is coupled with a subsequent photo sensor and P-type transistor as a driving element.

Figure 8:
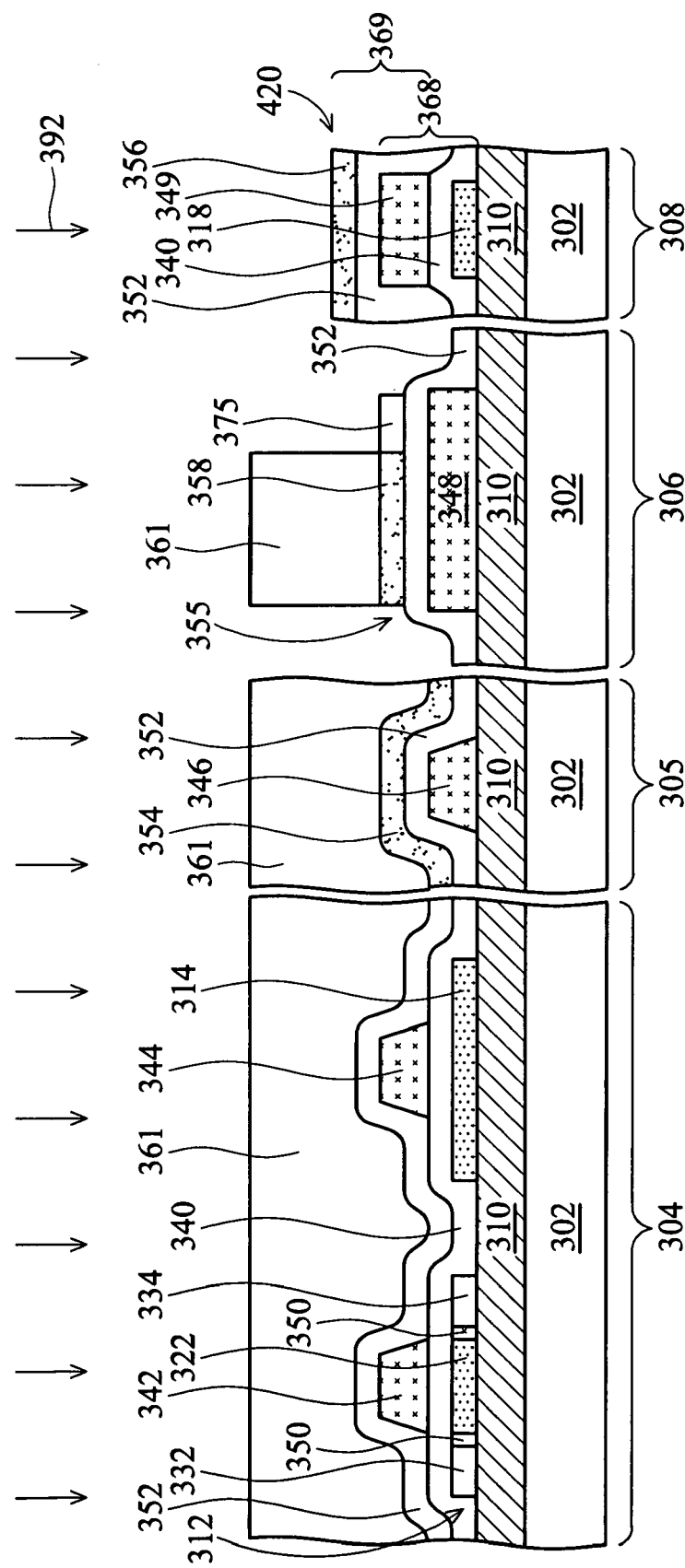

As FIG. 8 shows, the first control area 304, the second control area 305 and a portion of the photo-sensing layer 355 are respectively covered by a photoresist layer 361. Then N+ ions 392 are implanted into the photo-sensing layer 355 and the third electrode 356 for forming an N+ region 375, an intrinsic area 358, and the third electrode 356 region having N+ ions of a photodiode.

Figure 9:
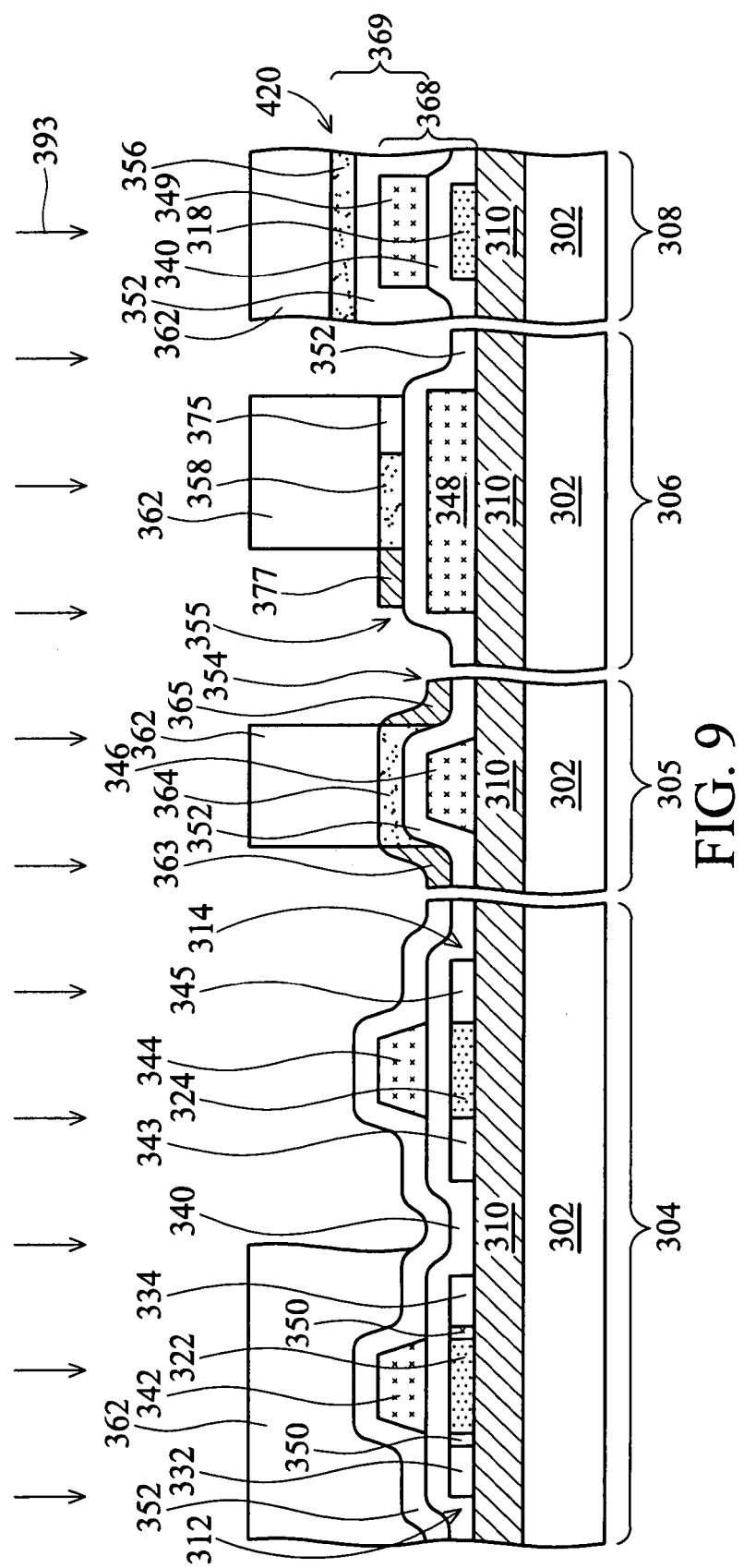

Referring to FIG. 9, the photoresist layer 361 is removed and then the polysilicon active layer 312, a predetermined channel region of the micro-crystal silicon active layer 354, the intrinsic area 358 and the N+ region 375 of the photo-sensing layer 355 and the capacitor area 308 are covered by another patterned photoresist layer 362, implanting P+ ions 393 into the polysilicon active layer 314 of the first control area 304 to form a source 343 and a drain 345 of a P-type transistor and a channel area 324 which is covered by the gate 344. Simultaneously, P+ ions 393 are implanted into the micro-crystal silicon active layer 354 and the photo-sensing layer 355, thus, a source 363, a drain 365 and a channel region 364 undoped with P+ ions 393 of another P-type transistor are formed on the second control area 305. Also, another P+ region 377 is formed on the side of the intrinsic area 358 of the photo-sensing layer 355.

Figure 10:
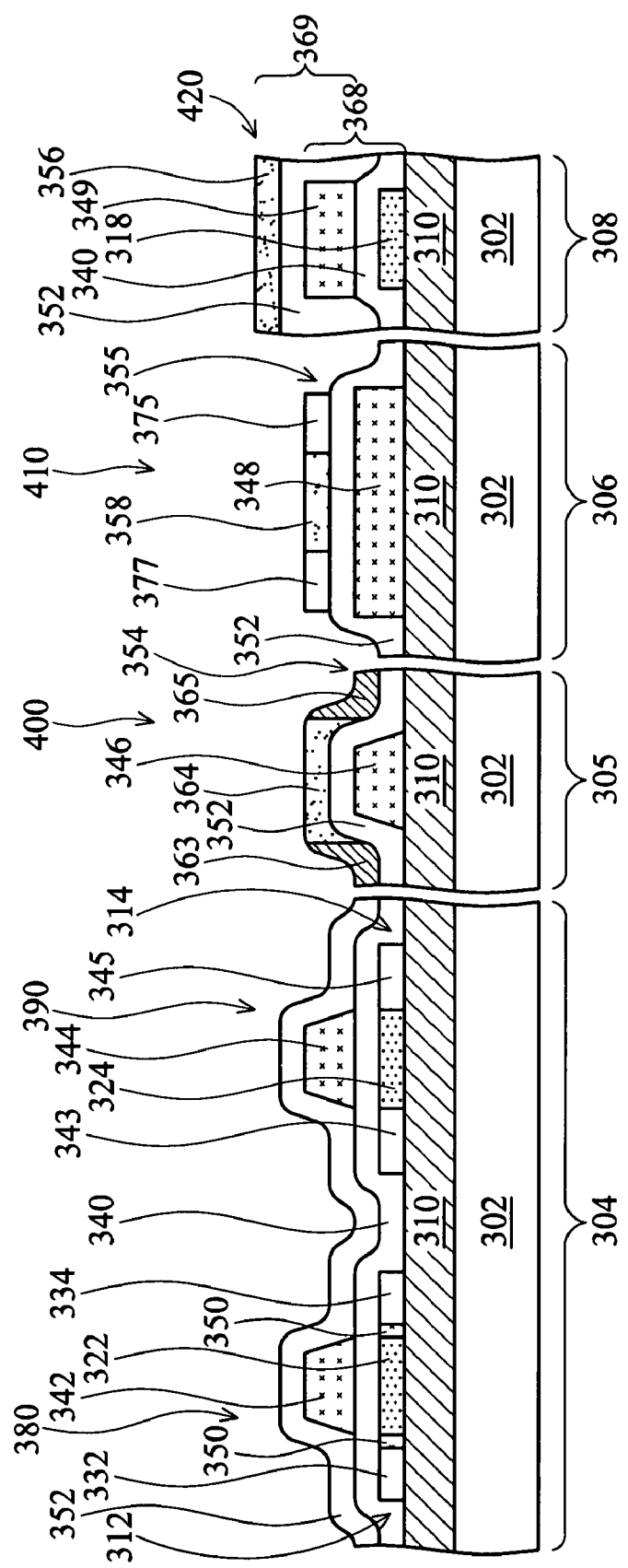

Referring to FIG. 10, the patterned photoresist layer 362 is removed, and an N-type transistor 380 having the polysilicon active layer 312 and a P-type transistor 390 having the polysilicon active layer 314 are formed on the first control area 304. Moreover, a P-type transistor 400 having the micro-crystal silicon active layer 354 is formed on the second control area 305 and a photo sensor 410 having the photo-sensing layer 355 is formed on the sensitive area 306. In this embodiment, the N-type transistor 380 and the P-type transistor 390 serve as a switch element, whereas the P-type transistor 400 serves as a driving element.

The N-type transistor 380 and the P-type transistor 390 can be a top gate transistor, and the P-type transistor 400 can be a bottom gate transistor. In another embodiment according to the invention, a N-type transistor and a P-type transistor are formed on a non-display area of the substrate 302, which may be formed with essentially the same materials and methods as the N-type transistor 380 or the P-type transistor 390 and serve as an external driving element (not shown).

It should be noted that the polysilicon active layer 312 and the polysilicon active layer 314 are composed of polysilicon, whereas the micro-crystal silicon active layer 354, the photo-sensing layer 355 and the third electrode 356 are composed of micro-crystal silicon. Since the micro-crystal silicon active layer 354 of the P-type transistor 400 is composed of micro-crystal silicon which has relatively uniform grain size, carriers may have similar speeds when the source 363 and the drain 365 transmit the carriers to the micro-crystal silicon active layer 354. Specifically, the non-uniform grain size of the polysilicon of the P-type transistor 400 in the display area formed by a conventional laser anneal process will decrease, by using the micro-crystal silicon active layer 354. Therefore, improving image defects, such as image mura.

The embodiments have several advantageous features. For example, since the capacitor 420 can be formed by capacitors electrically connected in parallel, the capacitance of the capacitor 420 can be raised. Alternatively, a capacitance of the capacitor 420 can be the same as the capacitance of a conventional capacitor by decreasing the occupied area of the capacitor 420 so as to increase the aperture ratio of pixels.

Moreover, the photo-sensing layer 355 is composed of micro-crystal silicon which has wider absorption spectrum than polysilicon, thus the photo-sensing layer 355 can be used instead of a conventional polysilicon photo-sensing layer.

Figure 11:
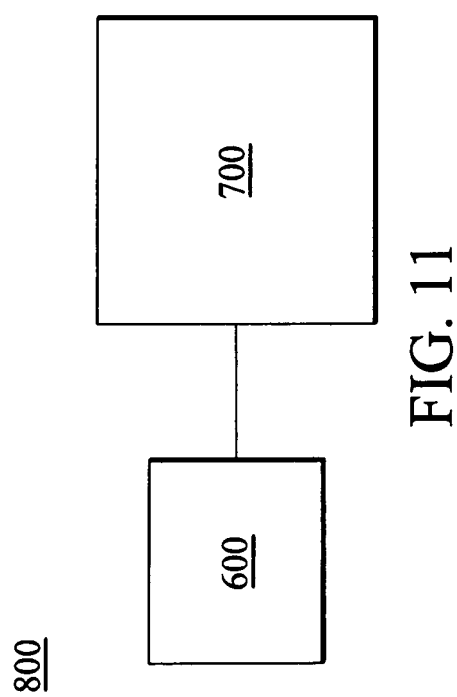
FIG. 11 shows a display element incorporated into an electronic device.

FIG. 11 schematically shows an embodiment of a system for displaying images according the present invention, in this case, which is implemented as an OLED display panel 700 or an electronic device 800. Generally, the electronic device 800 can comprise an input unit 600 and the OLED display panel 700. Further, the input unit 600 is operatively coupled to the OLED display panel 700 and provides input signals (e.g., an image signal) to the OLED display panel 700 to generate images. The electronic device 800 can be a mobile phone, digital camera, PDA (personal data assistant), notebook computer, desktop computer, television, GPS (Global Positioning System), car display, aviation display, digital photo frame or portable DVD player, for example.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electroluminescent device, comprising:
    a substrate, comprising a first control area and a second control area;
    a polysilicon active layer disposed on the first control area;
    a first conductivity type source/drain area disposed in the polysilicon active layer;
    a first dielectric layer disposed on the polysilicon active layer serving as a first gate dielectric layer;
    a first gate and a second gate disposed over the polysilicon active layer and the second control area respectively, wherein the first gate and the first conductivity type source/drain area constitute a first conductivity type thin film transistor serving as a switch element;
    a second dielectric layer disposed on the first gate and the second gate serving as a second gate dielectric layer;
    a micro-crystal silicon active layer disposed over the second gate; and
    a second conductivity type source/drain area disposed in the micro-crystal silicon active layer, wherein the second gate and the second conductivity type source/drain area constitute a second conductivity type thin film transistor serving as a driving element.

2. The organic electro luminescent device as claimed in claim 1, wherein the substrate further comprises a sensitive area, comprising:
    a light shielding metal layer disposed on the substrate; and
    a photo-sensing layer disposed on the light shielding metal layer, wherein the second dielectric layer is extended to the sensitive area and is between the light shielding metal layer and the photo-sensing layer.

3. The organic electro luminescent device as claimed in claim 1, wherein the substrate further comprises a capacitor area, comprising:
    a first electrode disposed on the substrate; and
    a second electrode disposed on the first electrode, wherein the first dielectric layer is extended to the capacitor area and is between the first electrode and the second electrode such that the first electrode, the second electrode and the first dielectric layer constitute a first storage capacitor.

4. The organic electro luminescent device as claimed in claim 1, wherein the substrate further comprising an external driving element having a thin film transistor.

5. The organic electro luminescent device as claimed in claim 2, wherein the photo-sensing layer is comprised of micro-crystal silicon.

6. The organic electroluminescent device as claimed in claim 3, further comprising a third electrode disposed on the second electrode, wherein the second dielectric layer is extended to the capacitor area and is between the second electrode and the third electrode such that the second electrode, the third electrode and the second dielectric layer constitute a second storage capacitor.

7. The organic electro luminescent device as claimed in claim 6, wherein the first storage capacitor and the second storage capacitor are connected in parallel.

8. A method for forming an organic electro luminescent device, comprising:
   providing a substrate comprising a first control area and a second control area;
   forming a polysilicon active layer on the first control area;
   forming a first conductivity type source/drain area in the polysilicon active layer;
   forming a first dielectric layer on the polysilicon active layer serving as a first gate dielectric layer;
   forming a first gate and a second gate on the polysilicon active layer and the second control area, respectively, wherein the first gate and the first conductivity type source/drain area constitute a first conductivity type thin film transistor serving as a switch element;
   forming a second dielectric layer on the first gate and the second gate serving as a second gate dielectric layer;
   forming a micro-crystal silicon active layer over the second gate; and
   forming a second conductivity type source/drain area in the micro-crystal silicon active layer, wherein the second gate and the second conductivity type source/drain area constitute a second conductivity type thin film transistor serving as a driving element.

9. The method as claimed in claim 8, further comprising:
   forming a light shielding metal layer on a sensitive area of the substrate; and
   forming a photo-sensing layer on the light shielding metal layer, wherein the second dielectric layer is extended to the sensitive area and is between the light shielding metal layer and the photo-sensing layer.

10. The method as claimed in claim 8, further comprising:
    forming a first electrode on a capacitor area of the substrate; and
    forming a second electrode on the first electrode, wherein the first dielectric layer is extended to the capacitor area and is between the first electrode and the second electrode such that the first electrode, the second electrode and the first dielectric layer constitute a first storage capacitor.

11. The method as claimed in claim 8, further comprising:
    forming an external driving element having a thin film transistor.

12. The method as claimed in claim 9, wherein the photo-sensing layer and the micro-crystal silicon active layer are formed simultaneously.

13. The method as claimed in claim 10, further comprising:
    forming a third electrode on the second electrode, wherein the second dielectric layer is extended to the capacitor area and is between the second electrode and the third electrode such that the second electrode, the third electrode and the second dielectric layer constitute a second storage capacitor.

14. The method as claimed in claim 13, wherein the first electrode with the polysilicon active layer, the second electrode with the gate, and the third electrode with the micro-crystal silicon active layer are formed simultaneously.

15. An electronic device, comprising:
    the organic electroluminescent device as claimed in claim 1; and
    an input unit coupled to the organic electro luminescent device and operative to provide input to the organic electroluminescent device such that the organic electro luminescent device displays images.

16. The organic electroluminescent device as claimed in claim 15, wherein the electronic device is a mobile phone, digital camera, PDA (personal data assistant), notebook computer, desktop computer, television, GPS (Global Positioning System), car display, aviation display, digital photo frame or portable DVD player.

* * * * *